United States Patent
Guo

(10) Patent No.: US 6,529,427 B1
(45) Date of Patent: Mar. 4, 2003

(54) TEST STRUCTURES FOR MEASURING DRAM CELL NODE JUNCTION LEAKAGE CURRENT

(75) Inventor: Jyh-Chyurn Guo, Hsin-Chu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 0 days.

(21) Appl. No.: 09/372,623

(22) Filed: Aug. 12, 1999

(51) Int. Cl.[7] ................................................ G11C 7/00
(52) U.S. Cl. ............ 365/201; 365/189.03; 365/230.01; 365/230.03
(58) Field of Search ........................... 365/201, 189.03, 365/230.01, 230.03

(56) References Cited

U.S. PATENT DOCUMENTS 5,703,825 A * 12/1997 Akiba et al. ................. 365/168
6,163,862 A * 12/2000 Adams et al. ............... 365/201
6,269,044 B1 * 7/2001 Tanida ......................... 365/201

* cited by examiner

*Primary Examiner*—Richard Elms
*Assistant Examiner*—Tuan T. Nguyen
(74) *Attorney, Agent, or Firm*—George O. Saile; Stephen B. Ackerman

(57) ABSTRACT

A method and methodology is provided for measuring ultra-low leakage current in DRAM devices. The invention provides a method and structures that are not limited to a trade-off between the number of contact points that are established to do the measurement and test accuracy, that can distinguish between diffusion junction leakage and leakage induced by contact regions and that can measure leakage current during on/off states of the word-line of a DRAM device.

42 Claims, 8 Drawing Sheets

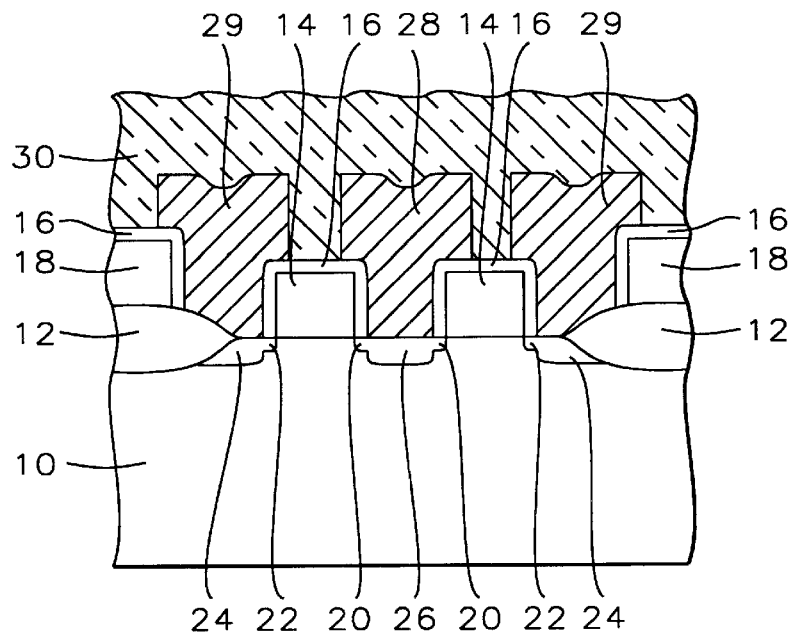
FIG. 1 - Prior Art
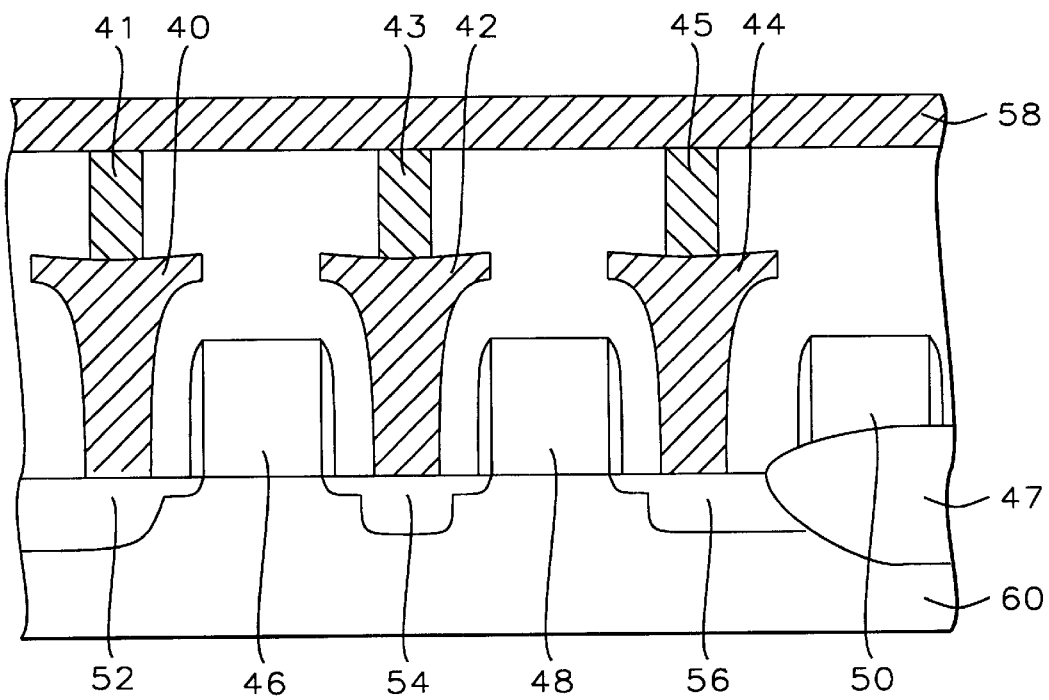
FIG. 2

TEST STRUCTURES FOR MEASURING DRAM CELL NODE JUNCTION LEAKAGE CURRENT

BACKGROUND OF THE INVENTION

1. Field of the Invention

The invention relates to the fabrication of integrated circuit devices, and more particularly, to a method of testing and monitoring leakage current on DRAM devices.

2. Description of the Prior Art

The functions that are performed by data processing systems can broadly be divided into the function of manipulating data, the logic function, and the function of retaining or storing data, the memory function. While these functions can at times be encountered on one and the same semiconductor chip, these function are in most cases provided by chips that are specifically dedicated to either one or to the other function.

This leads to the requirement that the logic chips and the memory chips must be interconnected since both types of chips are typically functionally dependent. This interconnect can degrade overall system performance and can bring with it problems of propagation delays of the electrical signals, electrical cross talk, interconnect line resistivity and others.

Continuous emphasis on improved performance of semiconductor devices has over the years resulted in a continuation of decreasing device features and increasing circuit density. Instrumental in this trend have been improvements in photolithographic techniques (allowing for reductions of device features and reductions in interconnect metal lines) and the increased use of self-aligning processing steps. These trends have led to device features in present designs that are in the sub-micron range.

The most widely used device that is used as a data storage or memory device is the Dynamic Random Access Memory (DRAM) chip. A single DRAM cell stores a bit of data on a capacitor as an electrical charge and typically consists of a single Metal Oxide Semiconductor Field Effect Transistor (MOSFET) for data access and a single capacitor for data storage. The above-indicated reduction in device feature size results, for the DRAM cell, in serious limitations to increased data storage capability. The process technology in the manufacturing of Dynamic Random Access Memory (DRAM) has, during the last several decades, migrated from 0.8 um 4M memories to 0.18 um 256M memories with a continuing decrease in memory cell size and concurrent increase in memory capacity. This scaling down in memory cell capacity puts increased emphasis on the cell's leakage current to maintain data retention capability.

One of the process technologies that have been used in the manufacturing of DRAM devices is the process of Selective Epitaxial Growth (SEG) of silicon. This process allows the deposition of a silicon epitaxial layer on a bare silicon surface without the simultaneous growth of amorphous silicon thin film on the silicon dioxide or silicon nitride interface. The SEG process has been used to develop an epitaxy-over-trench (EOT) process for DRAM technology. This approach allows the transfer transistor to be fabricated directly over the storage capacitor, resulting in a high density DRAM.

DRAM memory is so named because its cells can retain information only for a limited period of time before they must be read and refreshed at periodic intervals. A DRAM cell consists of one transistor and one storage capacitor. For bit densities of up to one megabit, planar-type storage capacitors are used. However, as storage densities increase, the amount of charges needed for a sufficient noise margin remains fixed. Therefore, in order to increase the specific capacitance, two different routes have been taken. The first solution is to store charges vertically in a trench. The second solution, which allows the cell to shrink in size without losing storage capacity, is to stack the capacitor on top of the access transistor. It is apparent from this that, as the memory density increases, the capacitor structure becomes more intricate and growth in the vertical direction.

DRAM storage cell capacity can be increased by making the capacitor dielectric thinner, by using a dielectric with a larger dielectric constant or by increasing the area of the capacitor. The first two options are not currently available since capacitor dielectrics thinner than those now being used in DRAM cells will suffer leakage due to an electron tunneling effect. The application of high dielectric-constant insulators other than $SiO_2$ and $Si_3N_4$ in DRAM cells has not yet matured for mass production.

It must also be noted that since the 256-kbit DRAM generation bi-layer films (consisting of both silicon nitride and $SiO_2$) have been used as the capacitor dielectric to increase cell capacitance. The higher dielectric constant Of $Si_3Ni_4$ (twice as large as that of $SiO_2$) was responsible for this increase.

The approach of storing charges vertically in a trench results in stacking the storage capacitor on top of the access transistor. The lower electrode of the stacked capacitor (STC) is in contact with the drain of the access transistor whereby the bit line runs over the top of the stacked capacitor. For STC cells to be made feasible for larger capacity DRAM's, an insulator with a larger dielectric constant than that of $SiO_2$ must be used.

For many manufacturers, dynamic random access memories (DRAM's) are the circuits which have the highest density and smallest feature size. However, the capacitance of a DRAM cannot be scaled at the same rate at which other circuit features are scaled back, beyond a certain point. One way therefore to maintain constant capacitance with decreasing feature size is to reduce the thickness of the dielectric material. This reduction brings with it increased susceptibility to higher leakage currents between the plates of the capacitor which in turn leads to a limitation on the voltage which can be applied across the capacitor. Since the charge stored is equal to the voltage across the capacitance times the capacitance, a reduction in the applied voltage requires a further increase in the capacitance in order to store the same charge, further aggravating the problem. The ability to store charge is then a function of either the thickness of the dielectric or the dielectric constant or the resistance to leakage current of the dielectric or the surface area of the capacitance.

Where silicon dioxide is the dielectric material, ultra thin dielectrics are difficult to fabricate, as these dielectric films are particularly susceptible to pin holes and other defects. Furthermore, these films are prone to high leakage currents and complete breakdown of the dielectric barrier region if high voltages are placed across the capacitor.

A common technique to increase the dielectric constant of a capacitor is to increase the dielectric constant of the capacitor from that of pure silicon dioxide.

Another technique is to decrease the leakage current between the plates of the capacitor. Different types of dielectric materials ($SiO_2$, $Si_3N_4$, $Ta_2O_5$) sandwiched between the two electrodes of a capacitor can result in the reduction of leakage current between the capacitor plates but this reduction is of limited extent. Additional methods and techniques are therefore needed to further reduce the leakage current.

FIG. 1 provides an overview of a typical DRAM cell and its sub-components. The DRAM structure is formed on the surface of a semiconductor substrate 10. The formation of the DRAM cell starts with the isolation of the active area of the DRAM by means of the layer 12 of LOCOS or STI that is formed around the active area. A layer of Field Oxide (FOX) is also typically used for this purpose; the isolating layer of oxide is a relatively thick layer of oxide between about 2000 and 3000 Angstrom. For the silicon substrate, typically a P-type single crystal with a crystalographic orientation of (100) is used. A thin (about 100 Angstrom thick) layer of gate oxide (not shown) is grown over the silicon surface to serve as stress release. A layer 14 of polysilicon is blanket deposited over which a layer of insulating material (not shown) is deposited. These two layers are patterned and etched to form gates 14 within the active area of the device and gates 18 on the surface of the LOCOS insulating area of the device. Gates 14 in the active area of the device form the gates of the MOSFET device, gates 18 form the word lines that connect the MOSFET gates to the peripheral circuits that are connected to the DRAM chip. The Lightly Doped (LDD) regions 20 and 22 for the source/drain regions of the N-channel MOSFET are then formed, typically by implant of an N-type dopant such as arsenic or phosphorous. Next the gate spacers 16 are formed over the surface of the patterned polysilicon gates 14 and 18. These spacers are typically formed by blanket depositing of a layer of low temperature silicon oxide and etching this layer anisotropically to the surface of the substrate. The source 24 and drain 26 regions are formed by implant with an N-type dopant, for instance phosphorous. The bit line 28 to the gate of the MOSFET device is formed by conventional methods of lithography and patterning. The storage node self-aligned contact points 29 are made in a similar manner. One (or more) layers 30 of insulation are then deposited over the structure to provide protection during further processing steps. The insulating layer may contain silicon oxide or silicon nitride. Over the insulating layer a further layer of dielectric may be deposited.

The invention specifically addresses problems of measuring leakage currents that are encountered in typical DRAM structures. During conventional methods of measuring leakage current, the following problems are typically encountered:

problems introduced by background noise and the leakage current induced by background noise. While performing leakage current measurements, background noise cannot be eliminated. The relative value of the induced leakage current due to background noise increases with decreasing device feature sizes (smaller and smaller junction leakage) that is being implemented in DRAM devices of reduced size the large number of contacts that are required in order to minimize the weighting factor of the background noise and the induced leakage current a trade-off must be made between the area that is or can be contacted to make measurements and the required accuracy of the measurement of the leakage current diffusion junction leakage and the contact formation leakage cannot be separately identified. Increased demands produced by improved Self-Aligned Contact (SAC) structures and processes require that an accurate method is available to identify individual sources of leakage currents and their contribution to the measured overall leakage current. This is required to for instance distinguish between leakage current that can be attributed to the diffusion process (diffusion junction) or the SAC process.

In view of the above indicated problems that are encountered with conventional methods of measuring DRAM device leakage currents, the invention provides new test structures and a new test methodology to measure these leakage currents.

SUMMARY OF THE INVENTION

A principle objective of the invention is to measure junction leakage currents for the DRAM cell storage capacitor and the bit-line node junction with an accuracy of measurement of between about $10^{-15}$ and $10^{-17}$ Amperes per contact junction at high temperatures, that is between about 85 and 125 degrees C.

Another objective of the invention is to eliminate inaccuracies that are introduced in measuring leakage current due to background noise.

Yet another objective of the invention is to reduce that large number of contacts that are required for conventional leakage current measurements.

A still further objective of the invention is to optimize the weighing factor that is required for leakage current that is introduced by background noise.

It is still another objective of the invention to eliminate the need for a trade-off between area contacted and the accuracy of the measurement in measuring leakage currents in DRAM devices.

It is still another objective of the invention to be able to clearly distinguish between the different sources and contributors of leakage currents in DRAM devices.

It is still another objective of the invention to be able to distinguish between diffusion junction leakage current and leakage current caused by contact formation.

In accordance with the objectives of the invention a new method and methodology is provided for measuring ultra-low leakage current in DRAM devices. The invention provides a method and test structures that are not limited to a trade-off between the number of contact points that are established to do the measurement and test accuracy, that can distinguish between diffusion junction leakage and leakage induced by contact regions and that can measure leakage current during on/off states of the word-line of a DRAM device.

BRIEF DESCRIPTION OF THE DRAWINGS

FIG. 1 provides an overview of a typical DRAM cell and its sub-components

FIG. 2 shows a cross section of a DRAM cell with contacts established to the bit-line and storage node self-aligned contacts.

DESCRIPTION OF THE PREFERRED EMBODIMENTS

Figure 3:
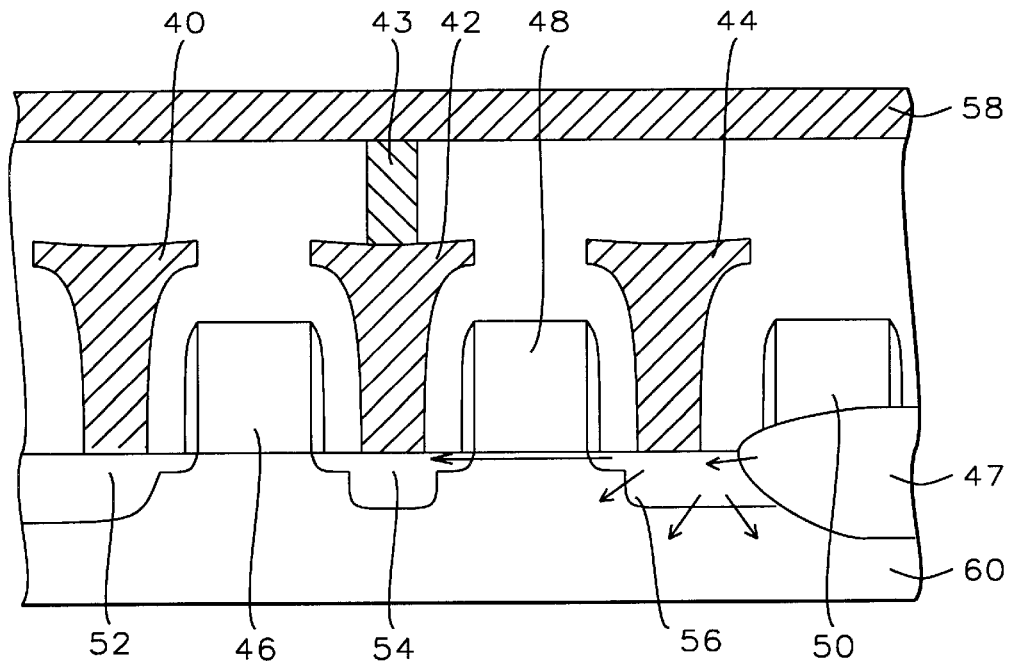
FIG. 3 shows a cross section of a DRAM cell with contacts established to the bit-line self-aligned contact and with the storage node self aligned contacts in place.

For the purposes of measuring DRAM device leakage, the following currents are of importance:

background noise leakage and the current ($J_0$) induced by it. Background noise will be present for every measurement that is taken and has to be recognized as such gated diode leakage current under inversion conditions ($J_{inv}$). If the positive voltage that is applied to a gate is increased, the energy bands that relate to that gate are moved, causing the semiconductor surface to be inverted. That is, the semiconductor surface is changed from p-type to n-type because there are now more electrons than there are holes at the surface of the semiconductor. This is the condition of inversion. An electron that occupies energy at the conduction band edge has zero kinetic energy. Therefore, under biasing conditions of depletion or inversion, the electrons that are near the surface of the silicon, while having zero kinetic energy, occupy energy states of lower total energy than electrons that are further down into the surface of the silicon and that also have zero kinetic energy. If therefore a positive bias is applied to the gate, the electrons are more likely to fill such energy states near the surface of the silicon and, consequently, the concentration of electrons will be highest closer to the surface of the silicon total junction leakage current. With junction is meant the junction between the bit line and the underlying silicon substrate (the junction is referred to as C1C, the total leakage current for this junction is referred to as $J_{C1C}$) or the junction between the storage node and the underlying silicon substrate (the junction is referred to as C2, the total leakage current for this junction is referred to as $J_{C2}$). The following two leakage currents make up the junction leakage current node leakage current which is the leakage current that flows between the (bit-line or storage-node) contact node and the underlying silicon and is due strictly to the making of the contact between the contact node and the underlying silicon. This node leakage current is one of the two components of the previously indicated total junction leakage current, since this node leakage current applies to two different nodes it can be recognized for each of these nodes and is identified as $J_{C1C0}$ (for the C1C bit-line contact node) and $J_{C2O}$ (for the C2 storage node contact node)

diffusion leakage current, this is the leakage current that diffuses out from the source/drain regions to the underlying p-type silicon (the p-well). This diffusion leakage current is the second of the two components of the previously indicated total junction leakage current and is differentiated as leakage current ($J_{N-}$) that occurs with the word-line poly-plug and the underlying source/drain regions being connected or activated and the leakage current ($J_{NO-}$) that occurs without the word-line poly-plug and the underlying source/drain regions ($J_{NO-}$) being connected or activated.

In addition, there are two leakage currents that are measured using special constructions of the DRAM cell, as follows:

$J_{C1CO+}$ is the bit-line (C1C) node leakage current (the leakage current that is due strictly to making contact between the bit-line and the underlying silicon) for the case where no storage node poly plug is provided, and $J_{C2O+}$ is the storage (C2) node leakage current (the leakage current strictly due to making contact between the poly plug of the storage node and the underlying silicon) for the case where no bit-line contact is provided.

To summarize, the following leakage currents have been identified:

$$J_0 \; J_{INV} \; J_{C1C} \; J_{C2} \; J_{C1CO} \; J_{C2O} \; J_{N-} \; J_{NO-} \; J_{C1CO+} \; J_{C2O+}$$

These leakage currents can be described as follows:

Background noise induced current ($J_0$)

Junction inversion condition induced current ($J_{INV}$)

Total bit-line node Junction Leakage current ($J_{C1C}$) and Total storage node Junction Leakage current ($J_{C2}$)

Bit-line contact node leakage current ($J_{C1CO}$) and storage node contact node leakage current ($J_{C2O}$), components of the total junction leakage current Diffusion leakage current with the storage node poly plug and the underlying self-aligned contact source/drain regions ($J_N$) and Diffusion leakage current without the storage node poly plug and the underlying self-aligned contact source/drain regions ($J_{NO-}$), the other components of the total junction leakage current Bit-line contact leakage current where no storage node contact is provided ($J_{C1CO+}$), and Storage-node contact leakage current where no bit-line contact is provided ($J_{C2O+}$).

From the above it is clear that: $J_{C1C}=J_{C1C0}+J_{N-}$ and $J_{C2}=J_{C2O}+J_{N-}$.

The following observations are in place relating to the testing sequence of the invention:

all tests are performed adjusting the word-line biasing values, all leakage currents are measured between the bit-line and the p-well of the DRAM cell, some of the measurements require special DRAM structures where, in one case, the poly plug for the storage node are omitted and, in another case, the self-aligned contact for the bit-line is omitted.

It is the prime objective of the invention to measure the contact node leakage and the diffusion leakage current. Once these two leakage current are known, the total junction leakage current can be calculated for both the storage node contact and the bit line contact. Also measured are the node leakage current for the bit-line contact under conditions of no poly plug for the storage node and the node leakage current for the storage node contact under conditions of no bit-line contact. FIGS. 2 through 6 indicate the method that is used to achieve these objectives.

Referring now specifically to FIG. 2, there is shown a cross section of a DRAM cell with contact 43 established between the bit-line 58 and the bit-line self-aligned contact 42 and contacts 41 and 45 established between the bit-line 58 and the self-aligned contacts 40 and 44 of the poly plug of the storage node. The source/drain regions are indicated with 52/56 (source) and 54 (drain) respectively. The underlying p-well region 60 is created in the surface of a substrate 10. The word lines for the DRAM cell are highlighted with 46, 48 and 50. A LOCOS insulation region 47 is also indicated.

For the configuration that is shown in FIG. 2, the leakage current that flows between the bit line 58 and the p-well is the sum of the total junction leakage for each of the three contacts, thereby including the background noise leakage. The three contacts are as shown: one contact 42 of the bit-line, two contacts 40 and 44 for the storage nodes. This leakage current (between the bit-line 58 and the p-well 60) can be measured under conditions of the word lines 46/48/50 being in the off condition ($WL_{off}$, apply a negative bias or ground to the word lines 46/48/50) or under the condition of word lines 46/48/50 being in the on condition ($WL_{oN}$, apply a positive bias to the word lines 46/48/50). In the former condition, the word lines have no impact on the leakage current, under the latter condition the above highlighted inversion current will flow under the word line 48 and has to be taken into account. For the following equations, the symbol J refers to leakage current. The term "mea J" refers to measuring leakage current under a particular condition of voltage on the word line or configuration of the DRAM cell. The equations are, for the configuration that is shown in FIG. 2, as follows:

$$WL_{off} => \text{mea } J => J(wl-\text{off}) = J_{C1C} + 2J_{C2} + J_0$$

$$WL_{oN} => \text{mea } J => J(wl-\text{on}) = J_{C1C} + 2J_{C2} + J_{inv} + J_0.$$

It is clear from the two equations that, by subtracting the two indicated measurements, the value for $J_{inv}$ can be derived. Or, to formulate, $J_{inv} = J(wl-\text{on}) - J(wl-\text{off})$. It is therefore clear that, for the DRAM cell under discussion, the inversion current $J_{inv}$ has been determined.

The progress that is being made in measuring or calculating the various leakage currents and their components will be recorded by using the following matrix. The number of the figure (art work) that is discussed is listed in the first column, the component that has been determined under that discussion is indicated in the row of that figure, as follows:

| FIG. | $J_0$ | $J_{INV}$ | $J_{C1C}$ | $J_{C2}$ | $J_{C1C0}$ | $J_{C2O}$ | $J_{N-}$ | $J_{NO-}$ | $J_{C1CO+}$ | $J_{C2O+}$ |
|---|---|---|---|---|---|---|---|---|---|---|
| 2 |   | X |   |   |   |   |   |   |   |   |

Referring now to FIG. 3 there is shown a cross section of a DRAM cell with contacts established between the bit-line 58 and the bit-line self-aligned contact 42 and with the storage node self aligned contacts 40/44 in place but not contacted for measurement. Using this configuration, only the total junction leakage for the contact of the bit line 42 contact will flow for the case where the word lines 46/48/50 are off. With the word lines 46/48/50 in the electrically off condition, no inversion current occurs. With the word lines 46/48/50 in the electrically on condition, the inversion current $J_{inv}$ occurs in addition to the diffusion current $J_N$ to the p-well introduced by the contacts of the storage nodes. This can be expressed as follows, keeping in mind that the noise leakage current $J_0$ is (always) present:

$$WL_{off} => \text{mea } J => J(wl-\text{off}) = J_{C1C} + J_0$$

$$WL_{oN} => \text{mea } J => J(wl-\text{on}) = J_{C1C} + 2J_{N-} + J_{inv} + J_0$$

Manipulation of these latter two equations reveals that $J_{N-} = \frac{1}{2} ((J(wl-\text{on}) - J(wl-\text{off}) - J_{inv}))$ from which the value for $J_{N-}$ can be derived since the value for $J_{inv}$ has been calculated under the measurement configuration of FIG. 2. Furthermore, since $J_{C1C} = J_{C1C0} + J_{N-}$ from which follows that $J_{C1C0} = J_{C1C} - J_{N-}$, the value for $J_{C1C0}$ can also be derived.

Furthermore, the value of $J_{C1C}$ can be calculated using the relation: $J_{C1C} = (J_{N2} - J_{N1})/(N_2 - N_1)$ where $N_1$ and $N_2$ are contact numbers.

The leakage currents $J_{N2}$ and $J_{N1}$ are known at this time and have been measured using the test structure with contact numbers N1 and N2 respectively. The numbers N1 and N2 are contact numbers, this means that they are equal to the number of contacts that are being measured. In this context, a bit line forms a contact while a word line does not form a contact.

From the above it is clear that the measurement as performed under the configuration of FIG. 3, has resulted in deriving:

node leakage current ($J_{C1C0}$) for the C1C bit line node the diffusion leakage current ($J_{N-}$) into the p-well region that occurs with the poly-plug of the storage nodes and the underlying source/drain regions being connected or activated.

The measurement matrix can now be updated as follows:

| FIG. | $J_0$ | $J_{INV}$ | $J_{C1C}$ | $J_{C2}$ | $J_{C1C0}$ | $J_{C2O}$ | $J_{N-}$ | $J_{NO-}$ | $J_{C1CO+}$ | $J_{C2O+}$ |
|---|---|---|---|---|---|---|---|---|---|---|
| 2 |   | X |   |   |   |   |   |   |   |   |
| 3 |   |   |   |   | X |   | X |   |   |   |

Figure 4:
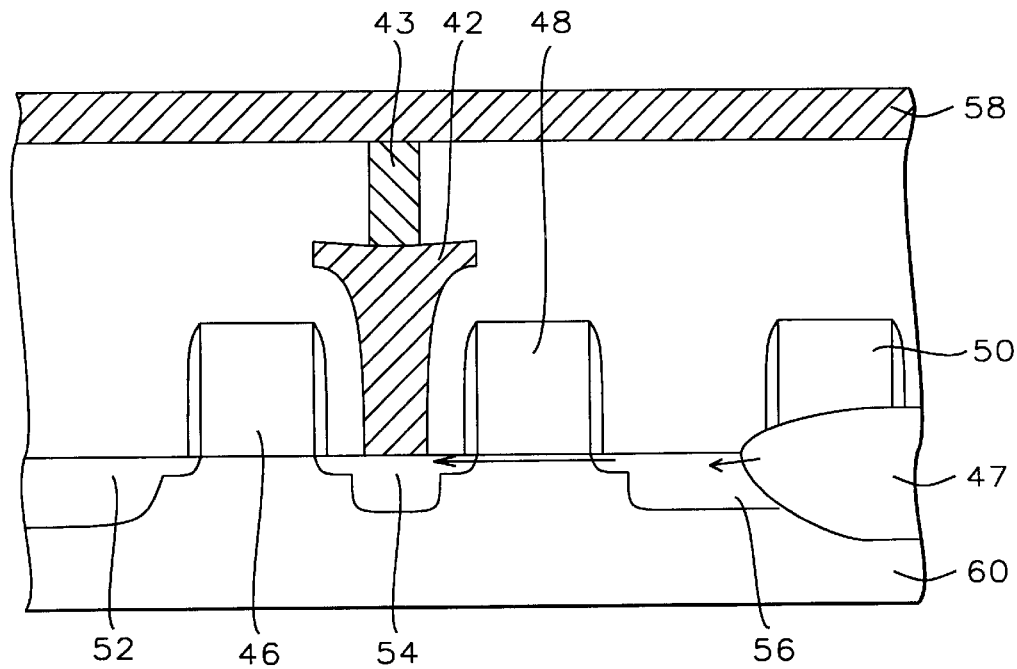
FIG. 4 shows a cross section of a DRAM cell with contacts established to the bit-line self-aligned contact and with no storage node self-aligned contacts in place.

Referring now to FIG. 4, there is shown a cross section of a DRAM cell with contacts 43 established between the bit-line and the self-aligned contact of the bit-line and with no storage node self-aligned contacts in place. The word line can again be turned on and off, in the condition where the word line is turned on the currents of total junction leakage, diffusion to the p-well junction (but with no storage node plugs and therefore no source induced diffusion), inversion and background noise occur. The equations for the configuration are therefore as follows:

$$WL_{off} => \text{mea } J => J(wl-\text{off}) = J_{C1C} + J_0$$

$$WL_{oN} => \text{mea } J => J(wl-\text{on}) = J_{C1C} + 2J_{NO-} + J_{inv} + J_0.$$

Manipulation of these latter two equations reveals that $J_{NO-} = \frac{1}{2} ((J(wl-\text{on}) - J(wl-\text{off}) - J_{inv}))$ from which the value for $J_{NO-}$ can be derived since the value for $J_{inv}$ has been calculated under the measurement configuration of FIG. 2. Furthermore, since $J_{C1C} = J_{C1C0+} + J_{NO-}$ from which follows that $J_{C1C0+} = J_{C1C} - J_{NO-}$, the value for $J_{C1C0+}$ can also be derived.

The measurement matrix can now be updated as follows:

| FIG. | $J_0$ | $J_{INV}$ | $J_{C1C}$ | $J_{C2}$ | $J_{C1C0}$ | $J_{C2O}$ | $J_{N-}$ | $J_{NO-}$ | $J_{C1CO+}$ | $J_{C2O+}$ |
|---|---|---|---|---|---|---|---|---|---|---|
| 2 |   | X |   |   |   |   |   |   |   |   |
| 3 |   |   |   |   | X |   | X |   |   |   |
| 4 |   |   |   |   |   |   |   | X | X |   |

The absence of the storage node SAC in FIG. 4 can be explained as follows: the N–diffusion junction is formed by self-aligned implant through the poly gate, that is the word line poly plug is formed by using a mask (referred to as C1) while contacts (SAC's) to the poly plug are implemented by a mask (referred to as C1C) for the bit line and mask C2 for the storage node. The storage node SAC can therefore be made to "disappear" by skipping the C1 mask for the storage node.

The purpose of designing the different test structures of the invention is to separate and to extract the junction leakage current that is contributed by each of the specific processing steps such as the SAC etch, the plug doping, the LDD implant and diffusion and others.

Figure 5:
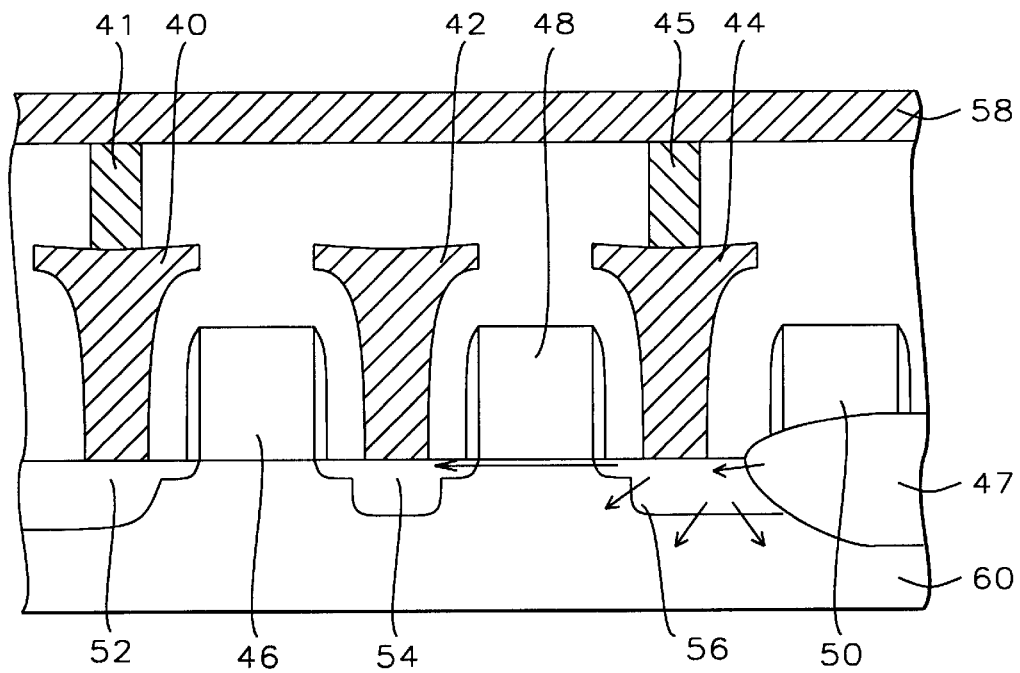
FIG. 5 shows a cross section of a DRAM cell with the bit-line self-aligned contact in place and with contacts established to the storage node self-aligned contacts in place.

Referring now to FIG. 5, there is shown cross section of a DRAM cell with the bit-line self-aligned contact 42 in place but not connected for measurement and with contacts established between the bit-line 58 and the storage node self-aligned contact 40 and 44. It is clear that, for the configuration shown in FIG. 5, the following equations are valid:

$$WL_{off} => \text{mea } J => J(wl-\text{off}) = 2J_{C2} + J_0$$

$$WL_{oN} => \text{mea } J => J(wl-\text{on}) = 2J_{C2} + J_{N-} + J_{inv} + J_0$$

Manipulation of these latter two equations reveals that $J_{N-} = J(wl-\text{on}) - J(wl-\text{off}) - J_{inv}$ from which the value for $J_{N-}$ can be derived since the value for $J_{inv}$ has been calculated under the measurement configuration of FIG. 2. Furthermore, since $J_{C2} = J_{C2O} + J_{N-}$ from which follows that $J_{C2O} = J_{C2} - J_{N-}$, the value for $J_{C2O}$ can be derived.

The measurement matrix can now be updated as follows:

| FIG. | $J_0$ | $J_{INV}$ | $J_{C1C}$ | $J_{C2}$ | $J_{C1CO}$ | $J_{C2O}$ | $J_{N-}$ | $J_{NO-}$ | $J_{C1CO+}$ | $J_{C2O+}$ |
|---|---|---|---|---|---|---|---|---|---|---|
| 2 |   | X |   |   |   |   |   |   |   |   |
| 3 |   |   |   | X |   | X |   |   |   |   |
| 4 |   |   |   |   |   |   | X | X |   |   |
| 5 |   |   |   |   | X | X |   |   |   |   |

Figure 6:
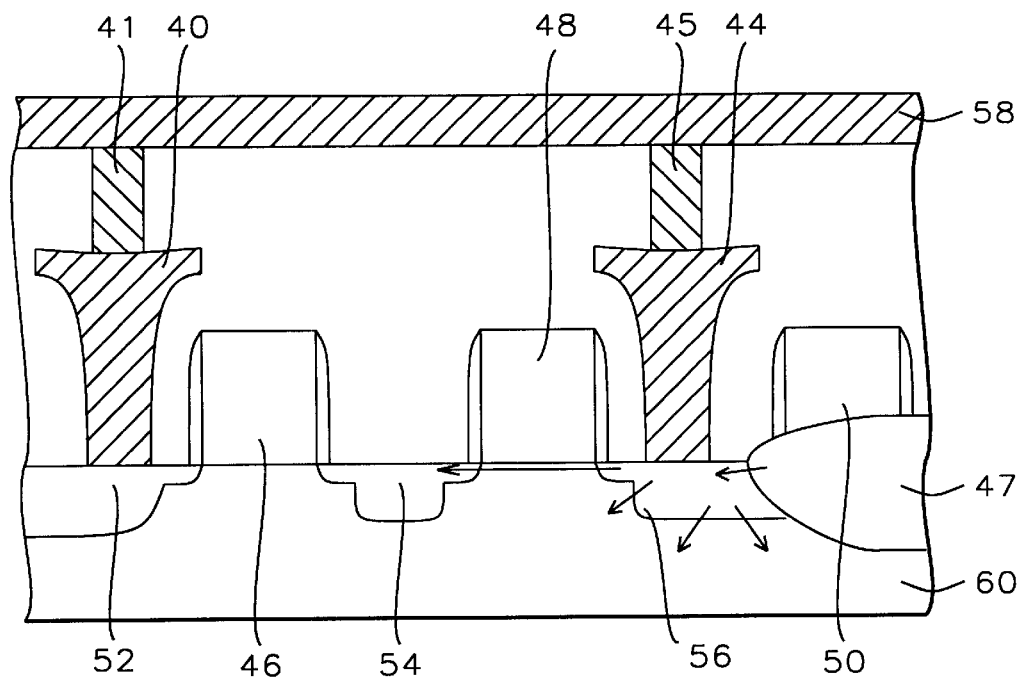
FIG. 6 shows a cross section of a DRAM cell with no bit-line self-aligned contact in place and with contacts established to the storage node self-aligned contacts in place.
Figure 7:
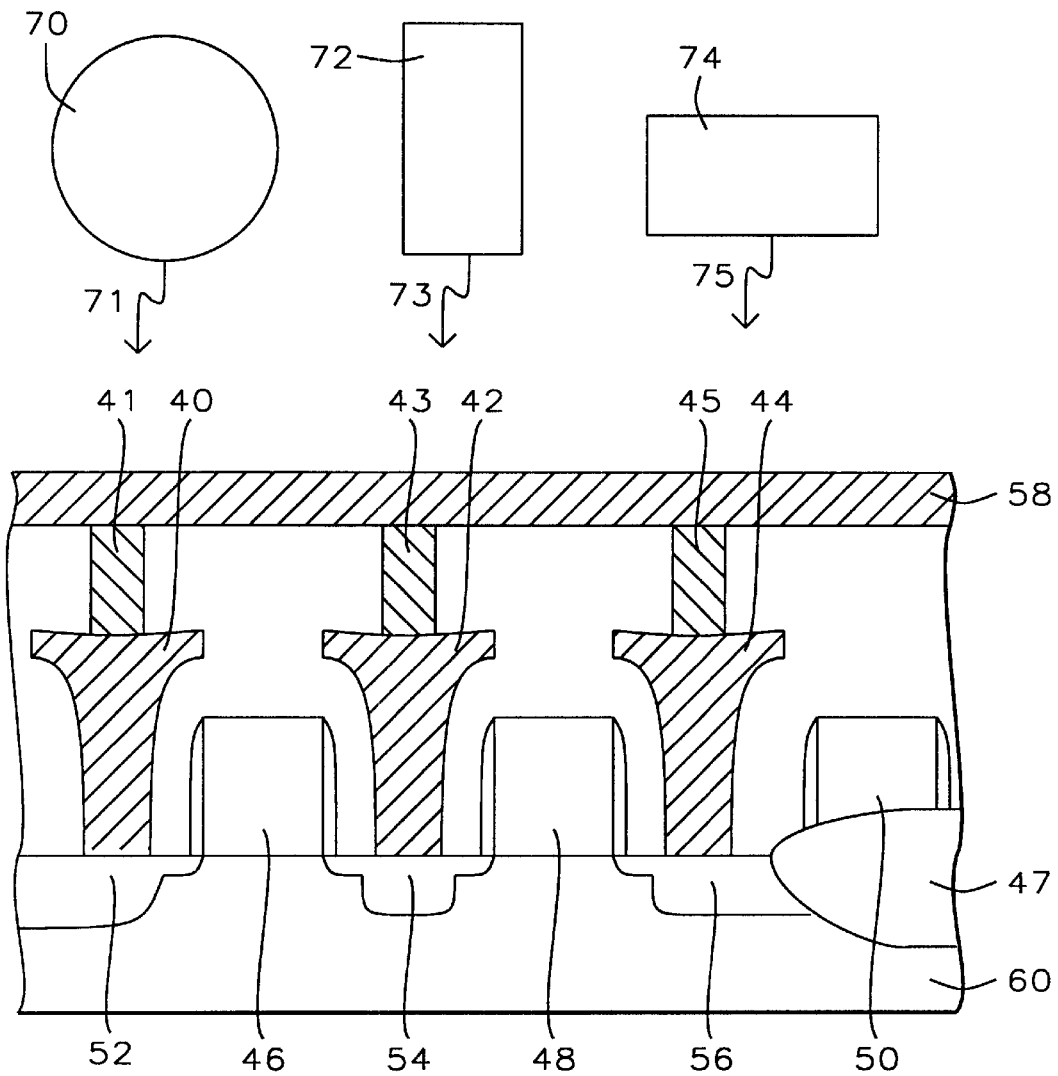
FIGS. 7 through 11 show aspects of testing, measuring and calculating as they relate to the invention.
Figure 8:
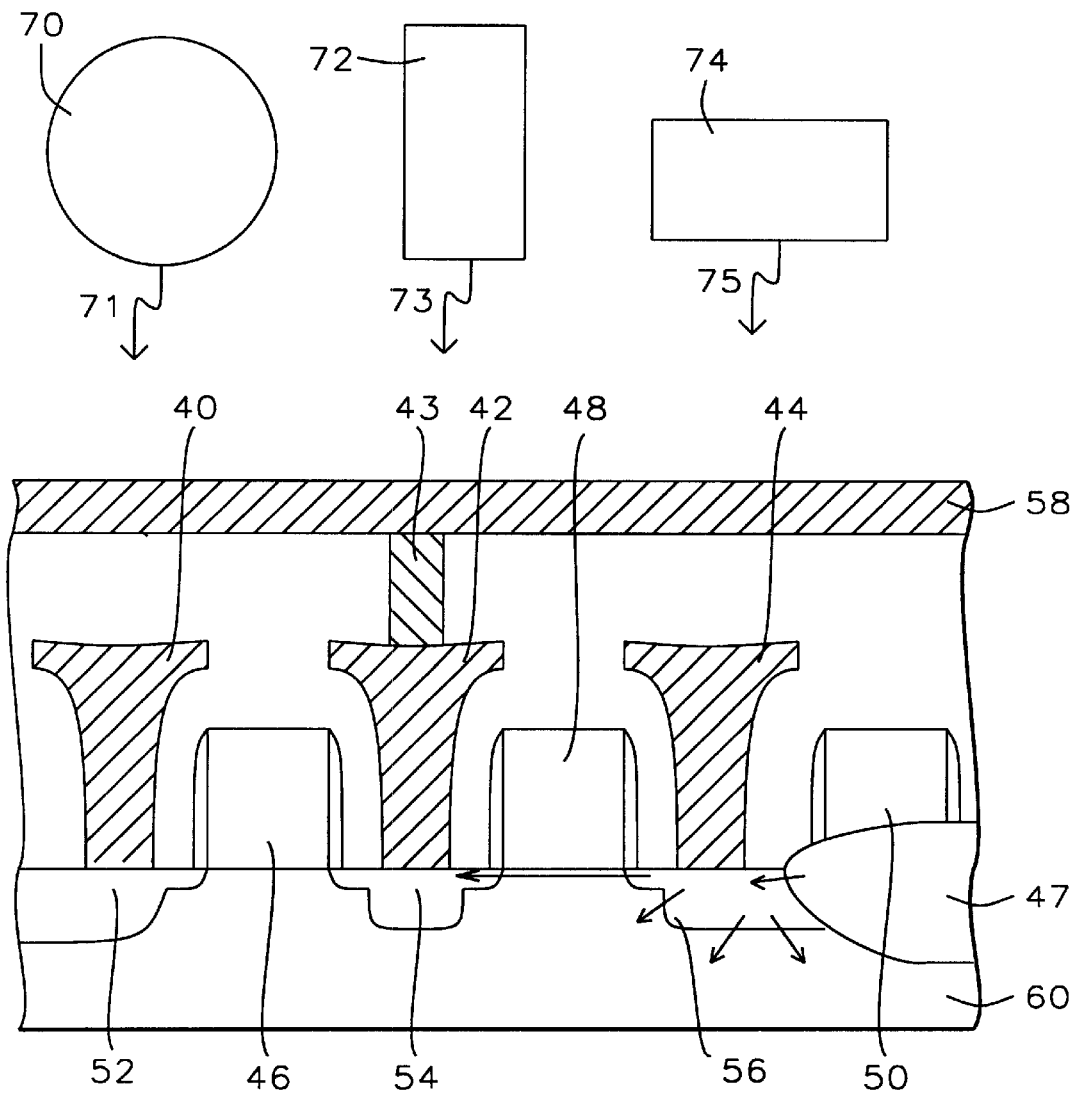
Figure 9:
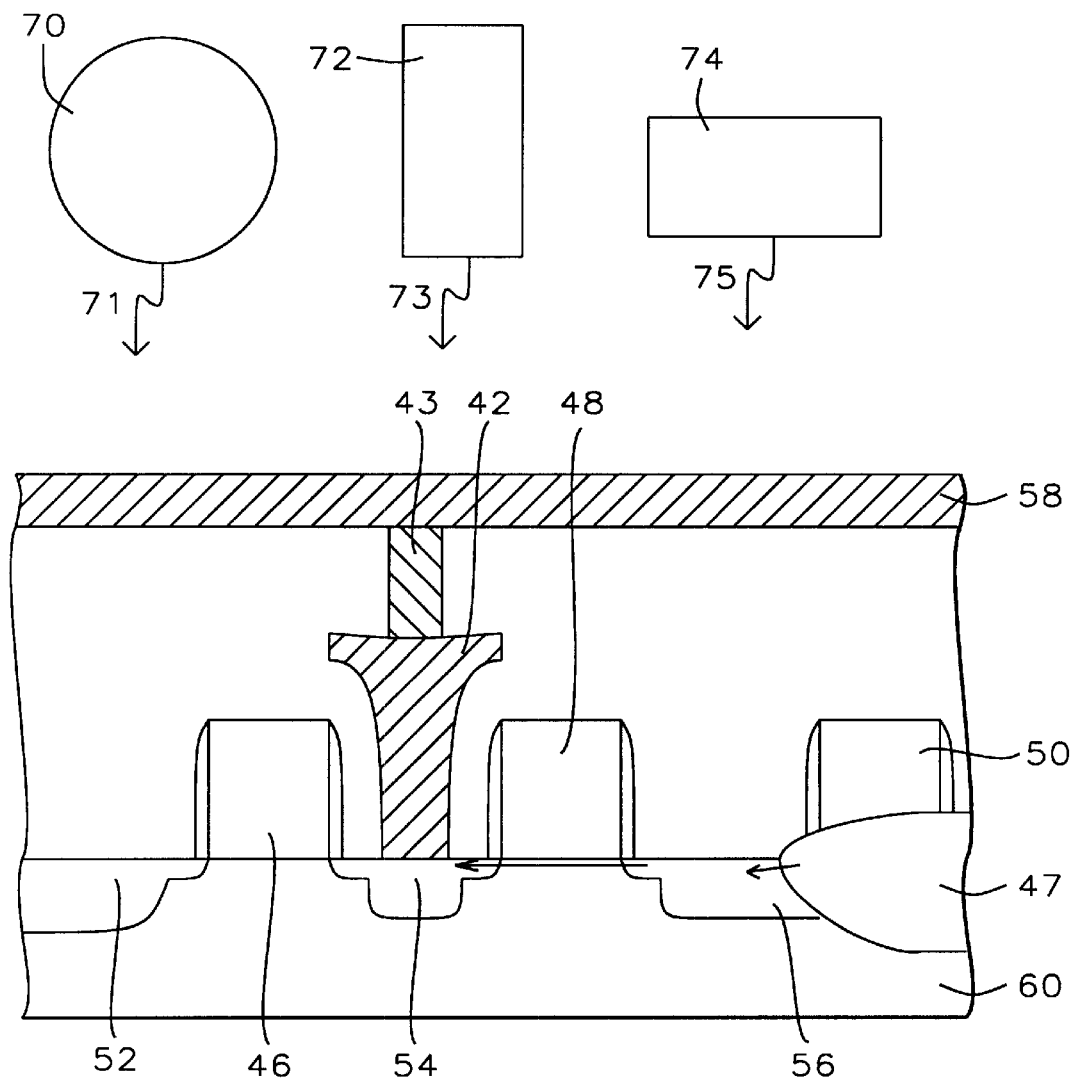
Figure 10:
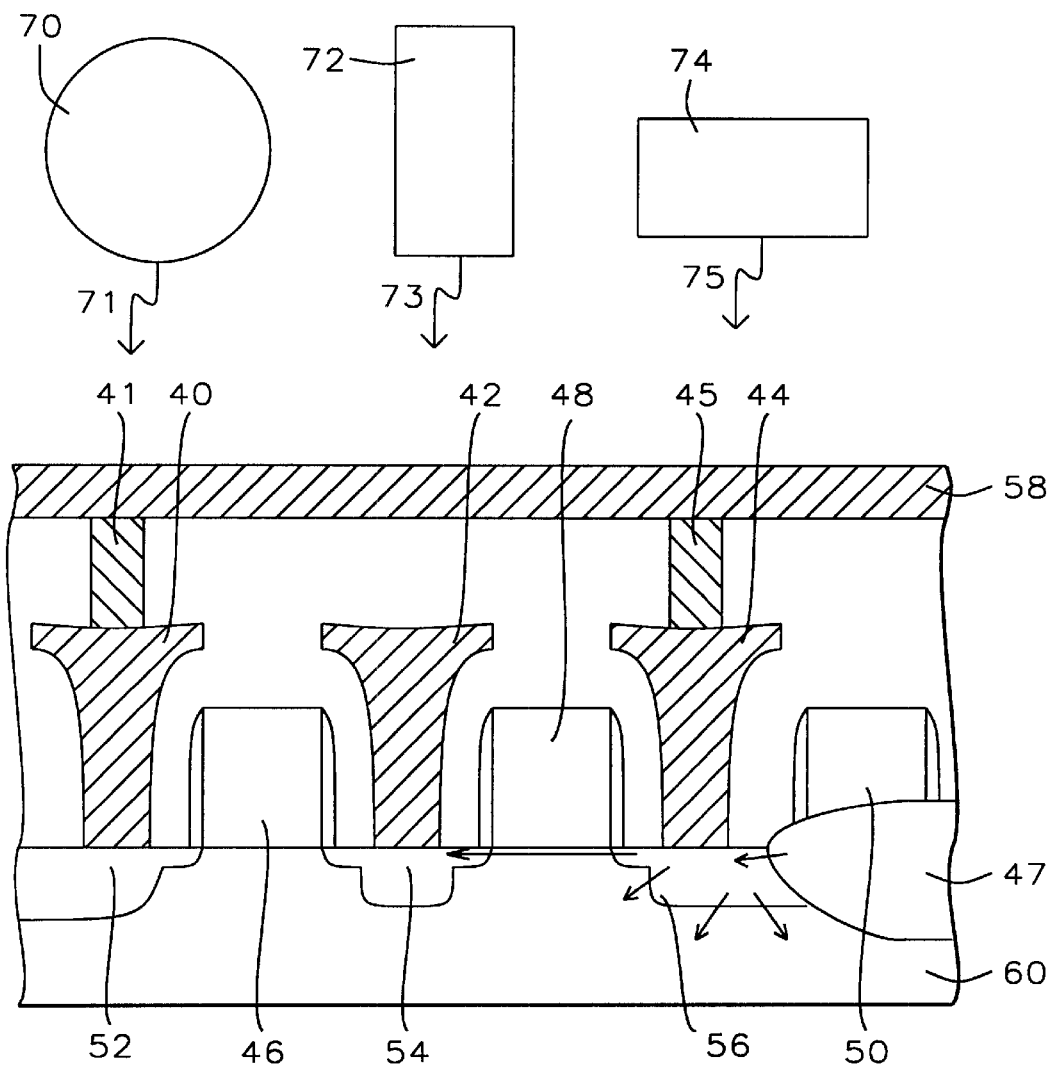
Figure 11:
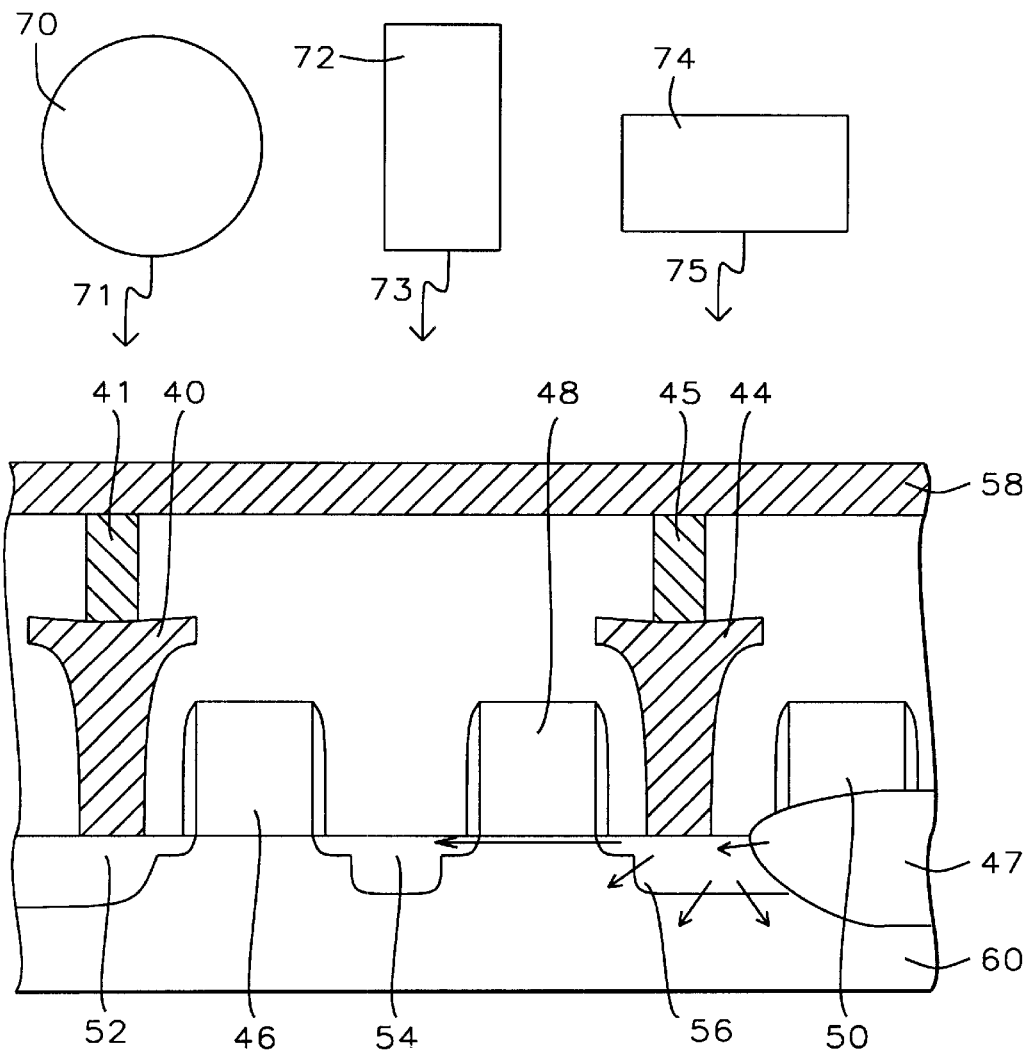

Referring now to FIG. 6, there is shown a cross section of a DRAM cell with no bit-line self-aligned contact in place and with contacts 41 and 45 established between the bit-line 58 and the storage node self-aligned contacts 40 and 44. By again switching the indicated word lines to the on and to the off conditions, the following equations can be derived:

$$WL_{off} => \text{mea } J => J(wl-\text{off}) = 2J_{C2} + J_0$$

$$WL_{oN} => \text{mea } J => J(wl-\text{on}) = 2J_{C2} + J_{NO-} + J_{inv} + J_0$$

Manipulation of these latter two equations reveals that $J_{NO-} = J(wl-\text{on}) - J(wl-\text{off}) - J_{inv}$ from which the value for $J_{NO-}$ can be derived since the value for $J_{inv}$ has been calculated under the measurement configuration of FIG. 2. Furthermore, since $J_{C2} = J_{C2O+} + J_{NO-}$ from which follows that $J_{C2O+} = J_{C2} - J_{NO-}$, the value for $J_{C2O+}$ can be derived.

The measurement matrix can now be updated as follows:

| FIG. | $J_0$ | $J_{INV}$ | $J_{C1C}$ | $J_{C2}$ | $J_{C1CO}$ | $J_{C2O}$ | $J_{N-}$ | $J_{NO-}$ | $J_{C1CO+}$ | $J_{C2O+}$ |
|---|---|---|---|---|---|---|---|---|---|---|
| 2 |   | X |   |   |   |   |   |   |   |   |
| 3 |   |   |   | X |   | X |   |   |   |   |
| 4 |   |   |   |   |   |   | X | X |   |   |
| 5 |   |   |   |   | X | X |   |   |   |   |
| 6 |   |   |   |   |   |   |   | X |   | X |

FIGS. 7 through 11 have been provided to illustrate aspects of testing, measuring and calculating as they relate to the invention and for each of the device configurations as they have been discussed using FIGS. 2 through 6, whereby specifically have been highlighted:

70, the means for calculating test results that have been obtained such as leakage current 71, the interface between the means for calculating test results 70 and the device of the invention that has been shown in FIGS. 2 through 6

72, the means for testing such as testing for leakage current 73, the interface between the means for testing 73 and the device of the invention that has been shown in FIGS. 2 through 6

74, the means for measuring one or more leakage currents, and 75, the interface between the means for measuring one or more leakage currents 73 and the device of the invention that has been shown in FIGS. 2 through 6.

The three columns whose values have so far not been determined are the columns for $J_0$, $J_{C1C}$ and $J_{C2}$. The $J_0$ is, as previously defined, the noise leakage component which is, by its very nature, indeterminate and which the method of the invention has negated in its impact on the measurement scheme. The other two parameters $J_{C1C}$ and $J_{C2}$ can readily be determined in view of the fact that $J_{C1C} = J_{C1C0} + J_{N-}$ and $J_{C2} = J_{C2O} - J_{N-}$.

The equation that can be used to calculate $J_{C1C}$ has previously been provide. In a similar manner, the value of $J_{C2}$ can be derived from another pair of contact arrays by using different numbers for $N_1$ and $N_2$.

There is as yet another test pattern that can be followed to measure the above derived $J_{C1C}$ and $J_{C2}$ for the case where multiple test probes and test sequences are executed on an array of DRAM cells. It N1 of these sequences are performed on N1 DRAM cells, and if $J_{N1}$ is defined as the total measured junction leakage current for all N1 DRAM cells under the conditions of word-line off, and $J_{N2}$ is defined as the total measured junction leakage current for all N1 DRAM cells under the conditions of word-line off, then the relations holds that:

$$J_{N1} = J_{C1C} \times N2 + J_O, \text{ and}$$

$$J_{N2} = J_{C1C} \times N2 + J_O, \text{ from which can be derived that}$$

$$J_{C1C} = (J_{N2} - J_{N1})/(N2-N1).$$

For the storage node contact this equation can be derived in a similar manner and becomes: $J_{C2} = (J_{N2} - J_{N1})/(N2-N1)$.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of testing DRAM devices, said method to comprise:

providing a DRAM device, said DRAM device containing a multiplicity of DRAM cells;

selecting at least one first set of three DRAM cells from said DRAM devices;

biasing said at least one first set of three DRAM cells, said biasing said at least one first set of three DRAM cells is providing one of ten different conditions of bias to the word lines of one of said three selected DRAM cells, said conditions of bias hereby referred to as bias 1 through and including bias 10, whereby it is assumed that all word lines contained within said at least one first set of three DRAM cells are biased at the same value of voltage, said three DRAM cells of said at least one one set of three DRAM cells being referred to as cell 1 and cell 2 and cell 3;

measuring at least one leakage current in said at least one first set of three DRAM cells; and calculating one or more leakage currents based on said measurements.

2. The method of claim 1 wherein said selecting at least one set of three DRAM cells from said DRAM devices is selecting three adjacent cells, hereby referred to as said cell 1, cell 2 and cell 3, where a set of three adjacent cells can be any set of three adjacent cells contained within said DRAM device.

3. The method of claim 1 wherein said measuring one or more leakage currents in said DRAM cell is performing ten different measurements hereby referred to as meas 1 through meas 10 by applying a particular condition of bias to a particular DRAM cell whereby said particular condition of bias is selected from said ten different conditions of bias and said particular DRAM cell is selected from said three adjacent cells whereby said measurement is performed by measuring the current that flows between the bit-line and the p-well regions of said DRAM cell.

4. The method of claim 1 wherein said calculating one or more leakage currents base on said measurements is deriving one or more values of leakage current from results that have been obtained by means of said or previous measurements of leakage current said calculation to be a total of nine calculations hereby referred to as calc 1 through calc 9.

5. The method of claim 2 wherein said cell 1 contains field isolation regions surrounding said DRAM cell, word lines in contact with the underlying substrate and said field isolation regions, source and drain regions, a bit-line self aligned contact (SAC) plug in contact with the underlying substrate, two storage nodes self-aligned contact (SAC) plugs in contact with the underlying substrate and a p-well region created in the underlying substrate.

6. The method of claim 2 wherein said cell 2 contains field isolation regions surrounding said DRAM cell, word lines in contact with the underlying substrate and said field isolation regions, source and drain regions, a bit-line self aligned (SAC) contact plug in contact with the underlying substrate and a p-well region created in the underlying substrate.

7. The method of claim 2 wherein said cell 3 contains field isolation regions surrounding the DRAM cell, word lines in contact with the underlying substrate and said field isolation regions, source and drain regions, two storage nodes self-aligned contact (SAC) plugs in contact with the underlying substrate and a p-well region created in the underlying substrate.

8. The method of claim 1 wherein said bias 1 is selecting said cell 1 and connecting the word line to ground thereby turning the word line to the off condition furthermore connecting the bit-line SAC and the two storage node SAC's to the bit line that is the bit-line for said DRAM cell.

9. The method of claim 1 wherein said bias 2 is selecting said cell 1 and connecting the word line to a positive voltage thereby turning the word line to the on condition furthermore connecting the bit-line SAC and the two storage node SAC's to the bit line that is the bit-line for said DRAM cell.

10. The method of claim 1 wherein said bias 3 is selecting said cell 1 and connecting the word line to ground thereby turning the word line to the off condition furthermore connecting the bit-line SAC to the bit line that is the bit-line for said DRAM cell.

11. The method of claim 1 wherein said bias 4 is selecting said cell 1 and connecting the word line to a positive voltage thereby turning the word line to the on condition furthermore connecting the bit-line SAC to the bit line that is the bit-line for said DRAM cell.

12. The method of claim 1 wherein said bias 5 is selecting said cell 2 and connecting the word lines to ground thereby turning the word lines to the off condition furthermore connecting the bit-line SAC to the bit line that is the bit-line for said DRAM cell.

13. The method of claim 1 wherein said bias 6 is selecting said cell 2 and connecting the word line to a positive voltage thereby turning the word line to the on condition furthermore connecting the bit-line SAC to the bit line that is the bit-line for said DRAM cell.

14. The method of claim 1 wherein said bias 7 is selecting said cell 1 and connecting the word line to ground thereby turning the word line to the off condition furthermore connecting the two storage node SAC's to the bit line that is the bit-line for said DRAM cell.

15. The method of claim 1 wherein said bias 8 is selecting said cell 1 and connecting the word line to a positive voltage thereby turning the word line to the on condition furthermore connecting the two storage node SAC's to the bit line that is the bit-line for said DRAM cell.

16. The method of claim 1 wherein said bias 9 is selecting said cell 3 and connecting the word line to ground thereby turning the word line to the off condition furthermore connecting the two storage node SAC's to the bit line that is the bit-line for said DRAM cell.

17. The method of claim 1 wherein said bias 10 is selecting said cell 3 and connecting the word line to a positive voltage thereby turning the word line to the on condition furthermore connecting the two storage node SAC's to the bit line that is the bit-line for said DRAM cell.

18. The method of claim 1 wherein said leakage currents are background noise induced current ($J_O$), junction inversion condition induced current ($J_{INV}$), total bit-line node junction leakage current ($J_{C1C}$), total storage node junction leakage current ($J_{C2}$), bit-line contact node leakage current ($J_{C1CO}$), storage node contact node leakage current ($J_{C2O}$), diffusion leakage current with the storage node poly plug and the underlying self-aligned contact source/drain regions in place ($J_N$), diffusion leakage current without the storage node poly plug and the underlying self-aligned contact source/drain regions in place ($J_{NO-}$), bit-line contact leakage current where no storage node contact is provided ($J_{C1CO+}$), and storage-node leakage current where no bit-line contact is provided ($J_{C2O+}$), whereby the symbol J refers to a leakage current.

19. The method of claim 3 wherein said meas 1 is selecting said cell 1 and applying said bias 1 to said cell 1 thereby measuring a first result $r1 = J_{C1C} + 2J_{C2} + J_O$, whereby the symbol J refers to a leakage current.

20. The method of claim 3 wherein said meas 2 is selecting said cell 1 and applying said bias 2 to said cell 1 thereby measuring a second result $r2 = J_{C1C} + 2J_{C2} + J_{INV} + J_O$, whereby the symbol J refers to a leakage current.

21. The method of claim 3 wherein said meas 3 is selecting said cell 1 and applying said bias 3 to said cell 1 thereby measuring a third result $r3 = J_{C1C} + J_O$, whereby the symbol J refers to a leakage current.

22. The method of claim 3 wherein said meas 4 is selecting said cell 1 and applying said bias 4 to said cell 1 thereby measuring a fourth result $r4 = J_{C1C} + 2J_{N-} + J_{INV} + J_O$, whereby the symbol J refers to a leakage current.

23. The method of claim 3 wherein said meas 5 is selecting said cell 2 and applying said bias 5 to said cell 2 thereby measuring a fifth result $r5 = J_{C1C} + J_O$, whereby the symbol J refers to a leakage current.

24. The method of claim 3 wherein said meas 6 is selecting said cell 2 and applying said bias 6 to said cell 2 thereby measuring a sixth result $r6=J_{C1C}+2J_{NO-}+J_{INV}+J_0$, whereby the symbol J refers to a leakage current.

25. The method of claim 3 wherein said meas 7 is selecting said cell 1 and applying said bias 7 to said cell 1 thereby measuring a seventh result $r7=2J_{C2}+J_0$, whereby the symbol J refers to a leakage current.

26. The method of claim 3 wherein said meas 8 is selecting said cell 1 and applying said bias 8 to said cell 1 thereby measuring an eighth result $r8=2J_{C2}+J_{N-}+J_{INV}+J_0$, whereby the symbol J refers to a leakage current.

27. The method of claim 3 wherein said meas 9 is selecting said cell 3 and applying said bias 9 to said cell 3 thereby measuring a ninth result $r9=2J_{C2}+J_0$, whereby the symbol J refers to a leakage current.

28. The method of claim 3 wherein said meas 10 is selecting said cell 3 and applying said bias 10 to said cell 3 thereby measuring a tenth result $r10=2J_{C2}+J_{NO-}+J_{INV}+J_0$, whereby the symbol J refers to a leakage current.

29. The method of claim 4 wherein said first calculation cal $1=r2-r1=J_{INV}$, whereby the symbol J refers to a leakage current, whereby the symbol r refers to a calculation result.

30. The method of claim 4 wherein said second calculation cal $2=\frac{1}{2}(r4-r3\ J_{INV})=J_{N-}$, whereby the symbol J refers to a leakage current, whereby the symbol r refers to a calculation result.

31. The method of claim 4 wherein said third calculation cal $3=J_{C1C}-J_{N-}=J_{C1CO}$, whereby the symbol J refers to a leakage current.

32. The method of claim 4 wherein said fourth calculation cal $4=\frac{1}{2}(r6-r5-J_{INV})=J_{NO-}$, whereby the symbol J refers to a leakage current, whereby the symbol r refers to a calculation result.

33. The method of claim 4 wherein said fifth calculation cal $5=J_{C1C}-J_{NO}=J_{C1CO+}$, whereby the symbol J refers to a leakage current.

34. The method of claim 4 wherein said sixth calculation cal $6=r8-r7=J_{N-}$, whereby the symbol J refers to a leakage current, whereby the symbol r refers to a calculation result.

35. The method of claim 4 wherein said seventh calculation cal $7=J_{C2}-J_{N-}=J_{C2O}$, whereby the symbol J refers to a leakage current.

36. The method of claim 4 wherein said eighth calculation cal $8=r10-r9-J_{INV}=J_{NO-}$, whereby the symbol J refers to a leakage current, whereby the symbol r refers to a calculation result.

37. The method of claim 4 wherein said ninth calculation cal $9=J_{C2}-J_{NO-}=J_{C2O+}$, whereby the symbol J refers to a leakage current.

38. The method of claim 1 wherein said testing contains a multiplicity of test sequences whereby each sequence contains the following steps performed in a sequence of:
   measuring r1 followed by measuring r2 followed by cal 1;
   measuring r3 followed by measuring r4 followed by cal 3 followed by cal 4;
   measuring r5 followed by measuring r6 followed by cal 4 followed by cal 5;
   measuring r7 followed by measuring r8 followed by cal 6 followed by cal 7; and
   measuring r9 followed by measuring r10 followed by cal 8 followed by cal 9, whereby the symbol r refers to a calculation result.

39. The method of claim 38 wherein said tests sequence can be executed a large number of times, whereby said large number of test executions can be performed on one or more DRAM cells contain ed in one or more DRAM cells, whereby said DRAM cells may or may not be interrelated.

40. The method of claim 1, wherein said method can further be expanded to a multiplicity of DRAM cells and therewith a multiplicity N1 and N2 of test contact points for measuring said DRAM cells where N1 applies to a condition where word lines are in an off condition, whereby furthermore N2 applies to a condition where word lines are in a one condition, whereby is measured $J_{N1}=J_{C1C} \times N1+J_O$ whereby furthermore is measured $J_{N2}=J_{C1C} \times N2+J_O$ resulting in a calculation of $J_{C1C}=(J_{N2}-J_{N2})/(N2-N1)$, thereby calculating a total bit-line node junction leakage current, whereby the symbol J refers to a leakage current.

41. The method of claim 1 wherein said method can be further be expanded to a multiplicity of DRAM cells and therewith a multiplicity N1 and N2 of test contact points for measuring said DRAM cells where N1 applies to the condition where the word line is in the off condition whereby furthermore N2 applies to the condition where the word lines are in the one condition whereby is measured $J_{N1}=J_{C2} \times N1+J_O$ whereby furthermore is measured $J_{N2}=J_{C2} \times N2+J_O$ resulting in the calculation of $J_{C2}=(J_{N2}-J_{N2})/(N2-N1)$ thereby calculating the total storage node junction leakage current, whereby the symbol J refers to a leakage current.

42. The method of claim 1 whereby said method for testing at least one first set of three DRAM cells is used for DRAM devices that are created in n-well regions.

* * * * *